(12) United States Patent
Parekh et al.

(10) Patent No.: US 9,263,095 B2
(45) Date of Patent: Feb. 16, 2016

(54) MEMORY HAVING BURIED DIGIT LINES AND METHODS OF MAKING THE SAME

(71) Applicant: Micron Technology, Inc., Boise, ID (US)

(72) Inventors: Kunal Parekh, Boise, ID (US); David Hwang, Boise, ID (US); Wen Kuei Huang, Boise, ID (US); Kuo Chen Wang, Chiayi (TW); Ching Kai Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 245 days.

(21) Appl. No.: 13/953,495

(22) Filed: Jul. 29, 2013

(65) Prior Publication Data

US 2013/0314967 A1    Nov. 28, 2013

Related U.S. Application Data

(63) Continuation of application No. 12/721,404, filed on Mar. 10, 2010, now Pat. No. 8,497,541.

(51) Int. Cl.
| | |
|---|---|
| *H01L 27/108* | (2006.01) |
| *G11C 5/06* | (2006.01) |
| *G11C 11/405* | (2006.01) |
| *H01L 29/66* | (2006.01) |
| *H01L 29/78* | (2006.01) |
| *G11C 5/02* | (2006.01) |
| *H01L 27/105* | (2006.01) |

(52) U.S. Cl.
CPC .................. *G11C 5/06* (2013.01); *G11C 5/025* (2013.01); *G11C 11/405* (2013.01); *H01L 27/108* (2013.01); *H01L 27/1052* (2013.01); *H01L 29/66666* (2013.01); *H01L 29/7827* (2013.01); *H01L 27/10879* (2013.01); *H01L 29/785* (2013.01)

(58) Field of Classification Search
CPC ............ H01L 27/108; H01L 27/10879; H01L 29/785
See application file for complete search history.

(56) References Cited

U.S. PATENT DOCUMENTS

| | | | |
|---|---|---|---|
| 6,181,620 B1 | 1/2001 | Agata et al. | |
| 6,310,880 B1 | 10/2001 | Waller | |
| 6,417,040 B2 | 7/2002 | Noble | |
| 6,440,801 B1 | 8/2002 | Furukawa et al. | |
| 7,042,047 B2 | 5/2006 | Eppich | |
| 7,365,385 B2 | 4/2008 | Abbott | |
| 7,368,365 B2 | 5/2008 | Wells | |
| 7,372,091 B2 * | 5/2008 | Leslie | 257/296 |
| 7,518,182 B2 | 4/2009 | Abbott et al. | |
| 7,521,322 B2 | 4/2009 | Tang et al. | |
| 2008/0173936 A1 * | 7/2008 | Yoon et al. | 257/329 |

* cited by examiner

*Primary Examiner* — Thanh V Pham
(74) *Attorney, Agent, or Firm* — Fletcher Yoder, P.C.

(57) ABSTRACT

A memory array having memory cells and methods of forming the same. The memory array may have a buried digit line formed in a first horizontal planar volume, a word line formed in a second horizontal planar volume above the first horizontal planar volume and storage devices formed on top of the vertical access devices, such as finFETs, in a third horizontal planar volume above the second horizontal planar volume. The memory array may have a 4F² architecture, wherein each memory cell includes two vertical access devices, each coupled to a single storage device.

23 Claims, 10 Drawing Sheets

MEMORY HAVING BURIED DIGIT LINES AND METHODS OF MAKING THE SAME

CROSS-REFERENCE TO RELATED APPLICATION

This is a continuation of U.S. patent application Ser. No. 12/721,404 which was filed on Mar. 10, 2010, now U.S. Pat. No. 8,497,541, which issued on Jul. 30, 2013, which is incorporated by reference in its entirety for all purposes.

BACKGROUND

1. Field of Invention

Embodiments of the invention relate generally to semiconductor devices, and more specifically, in certain embodiments, to memory devices.

2. Description of Related Art

Integrated circuit designers often desire to increase the level of integration or density of elements within an integrated circuit by reducing the size of the individual elements and by reducing the separation distance between neighboring elements. In addition, integrated circuit designers often desire to design architectures that are not only compact, but offer performance advantages, as well as simplified designs.

A relatively common integrated circuit device is a memory device. A memory device may include a memory array having a number memory cells arranged in a grid pattern. One type of memory cell is a dynamic random access memory (DRAM). In the simplest design configuration, a DRAM cell includes one access device, such as a transistor, and one memory storage structure, such as a capacitor. Other DRAM cells having more elements than a single access device and single storage device may be utilized to provide desired functionality, but having complex/increased structures. Modern applications for semiconductor devices can utilize vast numbers of DRAM unit cells, arranged in an array of rows and columns. The DRAM cells are electrically accessible through digit lines and word lines arranged throughout along the rows and columns of the array.

It may be desirable to design DRAM cells that have small feature sizes, as well as optimized performance. As feature sizes and dimensions between memory elements, and the word lines and digit lines that connect those memory elements is reduced, pattern noise may increase and other electrical performance may decrease. It would therefore be desirable to develop new semiconductor device constructions that can be utilized in semiconductor applications, such as DRAM structures.

DETAILED DESCRIPTION

Figure 1:
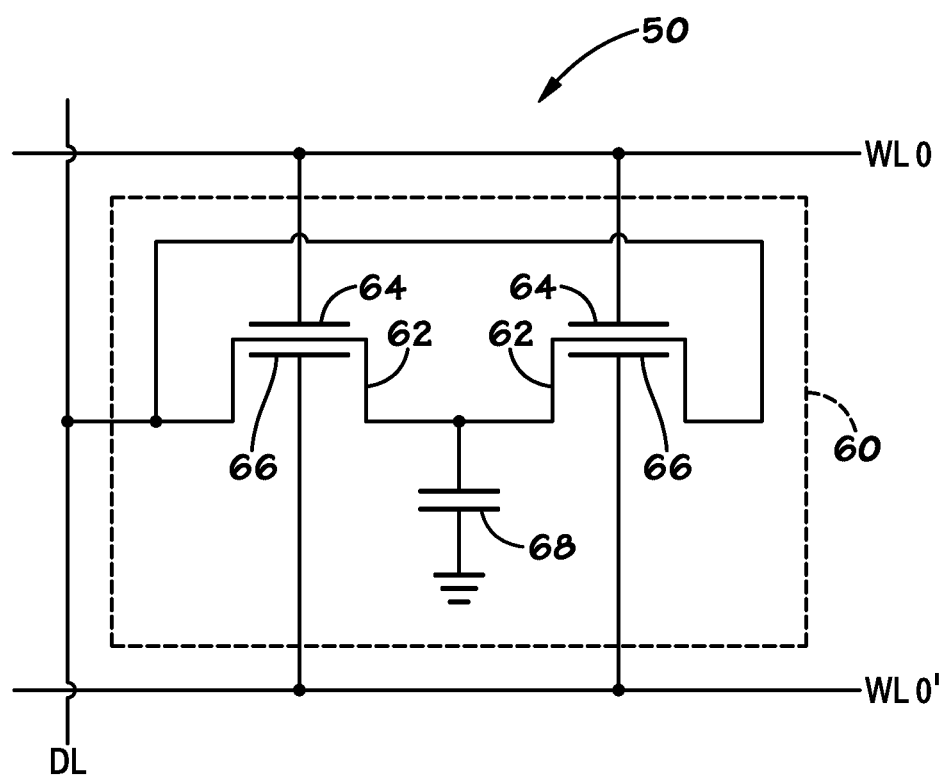
FIG. 1 illustrates a schematic diagram of a memory cell which may be fabricated in accordance with embodiments of the invention.

Turning now to the drawings, and referring initially to FIG. 1, a schematic diagram of one embodiment of a portion of a memory array 50, having a DRAM memory cell 60 is illustrated. As described further below, the DRAM memory cell 60 may be fabricated in accordance with embodiments of the present invention. While the simplest DRAM memory cell may include a single access device and a single storage device, the illustrated embodiment of the memory cell 60 includes two double gate field effect transistors (FETs) 62 which are implemented to provide access (i.e., the access device) to a storage device, here a capacitor 68. As will be appreciated, the DRAM memory cell 60 may be one of many cells arranged in an array of rows and columns. In the illustrated embodiment, each row of the memory array 50 is coupled to an access line pair, for example a word line pair, and each column of the memory array is coupled to a data/sense line, for example a digit line. Specifically, the first gates 64 of the FETs 62 are coupled to a first word line WL0, the second gates 66 of the FETs 62 are coupled to a second word line WL0', and the drains of the FETs 62 are coupled to a digit line DL. By controlling the first gates 64 via a voltage applied to the word line WL0 and/or by controlling the second gates 66 via a voltage applied to the word line WL0', a charge on the data line DL may be stored in the capacitor 68 or measured from the capacitor 68, as previously described. As will be described further below, the memory cells 60, and the entire DRAM memory array 50, may be fabricated in accordance with embodiments of the present invention.

Both word lines WL0 and WL0' may be tied together to effectuate an advantage of double gate transistors. When the separate word lines are coupled together, the effective resistance of the word lines is reduced and the access speed of the memory cell increases. Thus, the use of dual transistors also reduces the effective resistance and increases the speed of the memory cell.

As will be appreciated, the DRAM memory cell 60 may employ other configurations, such as a single transistor, single capacitor (1T1C) cell. Further, other access devices, in place of the FETs 62, and/or other storage devices, in place of the capacitor 68 may be employed. For example, in certain embodiments, it may be possible to replace the FETs 62 with other types of access devices, such as a Bipolar Junction Transistor (BJT) or an insulated gate bipolar transistor (IGBT). Further, the capacitor 68 may be replaced with a floating gate of a floating-gate transistor or a charge repository of a silicon-oxide-nitride (SONOS) device, or it may include a phase-change memory material, e.g., an ovonic material. In some embodiments, the capacitor 68 may be replaced with an SRAM memory element with a flip-flop, or it may include a programmable-metallization cell, a ferromagnetic-memory device, or a magnetoresistive-memory device. In other embodiments, the capacitor 68 may be replaced with an imaging device, such as a charge-coupled device or a photo diode, or another type of sensor, such as a chemical sensor.

Figure 2:
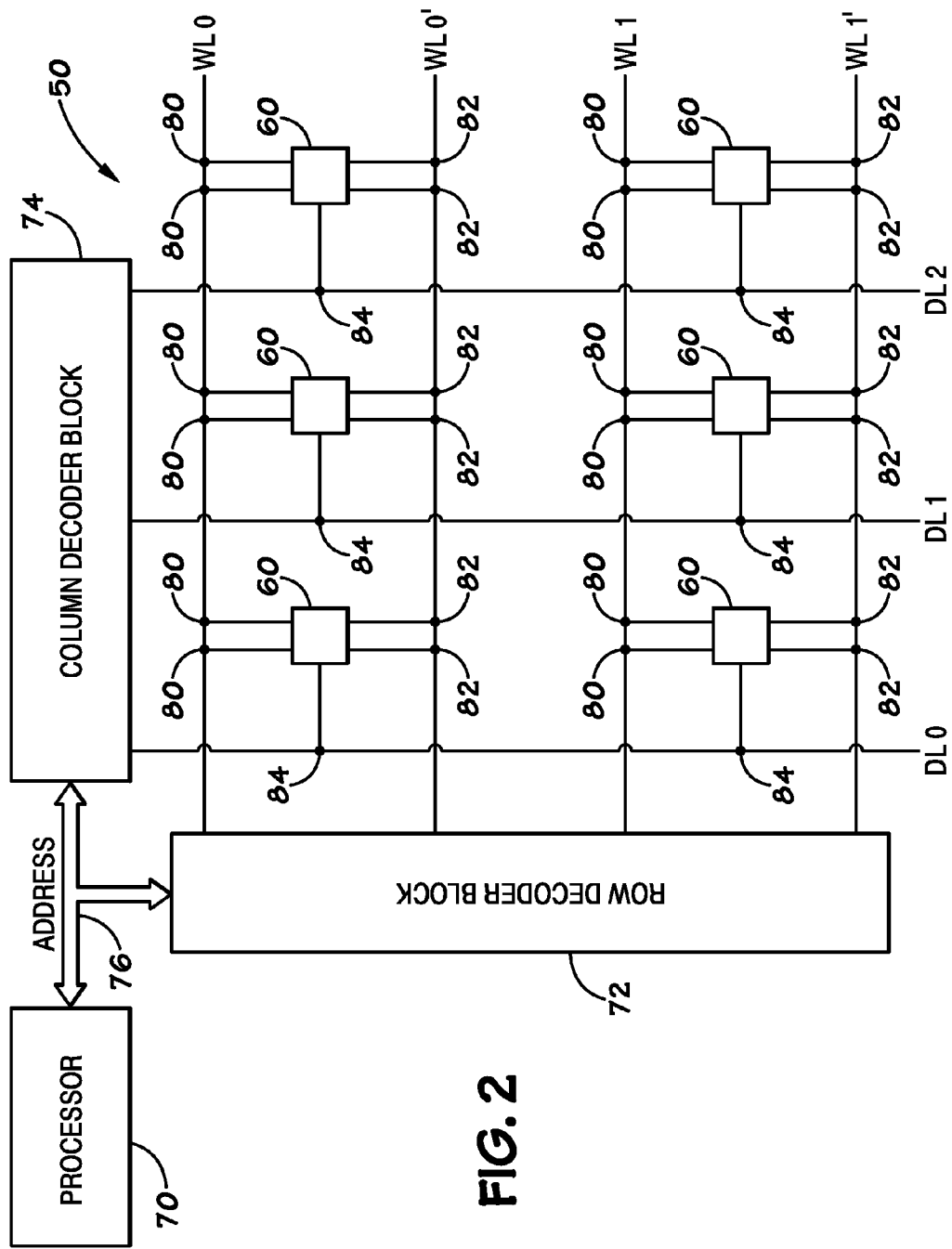
FIG. 2 illustrates a partial block diagram of a memory array which may be fabricated in accordance with embodiments of the invention.

Referring now to FIG. 2, a portion of a memory array 50, which may be fabricated in accordance with embodiments of the invention, is illustrated. As will be appreciated, the memory array 50 may be included in any processor-based system, for instance. The system may be any of a variety of types such as a computer, pager, cellular phone, personal organizer, portable audio player, control circuit, camera, etc. In a typical processor-based system, a processor 70, such as a microprocessor, controls the processing of system functions and requests, such as memory requests. Further, the processor 70 may include a plurality of processors that share system control. To access the memory array 50, a row decoder block 72 and a column decoder block 74 are provided and are configured to receive and translate address information from the processor 70 via the address bus 76 to access a particular memory cell in the memory array 50. As will be appreciated, various other components, including sense amplifiers and row/column drivers may also be included in the system. For simplicity, these and other commonly understood features have been omitted from the block diagram of FIG. 2.

As previously described, the memory array 50 includes a number of memory cells 60 arranged in a grid pattern and connected by a series of word lines (WL) and digit lines (DL). The digit lines DL are implemented to read and write data to the memory array, and the word lines WL are implemented to access a particular row of the memory array. The digit lines DL are connected to the column decoder block 74. The word lines WL are connected to the row decoder block 72. The column decoder block 74 and the row decoder block 72 are connected to the address bus 76, which may be connected to the processor 70.

More specifically, FIG. 2 illustrates an embodiment of a memory array having an open architecture. In the open architecture of this embodiment, each memory cell 60 is connected to a word line pair (e.g., WL0 and WL0'). Thus, as will be illustrated and described further below, in accordance with the present embodiments employing an open architecture, each memory cell 60 having a digit line contact 84 along a respective digit line (e.g., DL0), includes two word line contacts 80 on one word line and two word line contacts 82 on a second word line, coupling successive (i.e., immediately adjacent) memory cells in the column with two consecutive word lines for each memory cell (e.g., WL0 and WL0' for one memory cell in the column, WL1 and WL1' for a second memory cell in the column, etc.), rather than a single word line for each memory cell, as may be the case in other embodiments.

As previously discussed, one type of access device that may be employed, in accordance with embodiments of the invention is a FET. More specifically, in accordance with one embodiment, each access device may be a "finFET." FinFETs generally provide a convenient and compact way to provide transistors having a vertical fin structure wherein the transistor channel may be formed. Thus, as opposed to planar transistors having channels formed in a primarily horizontal direction, finFETs provide for fabrication of the channel in the vertical direction, relative to the plane of the substrate. Further, the three-dimensional nature of the finFET allows for a variety of designs that may be utilized to reduce the size of the array.

Figure 5:
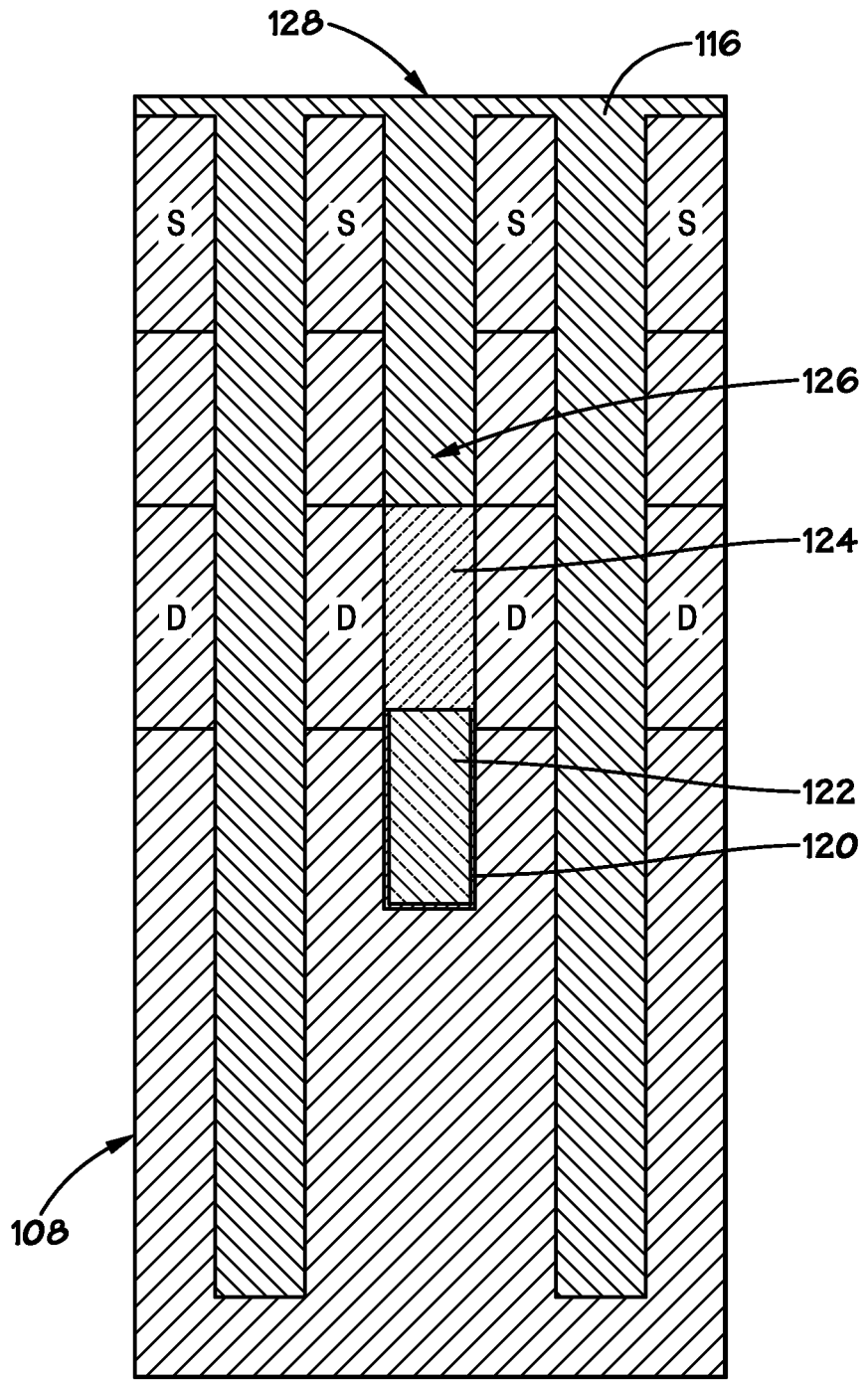
Figure 6:
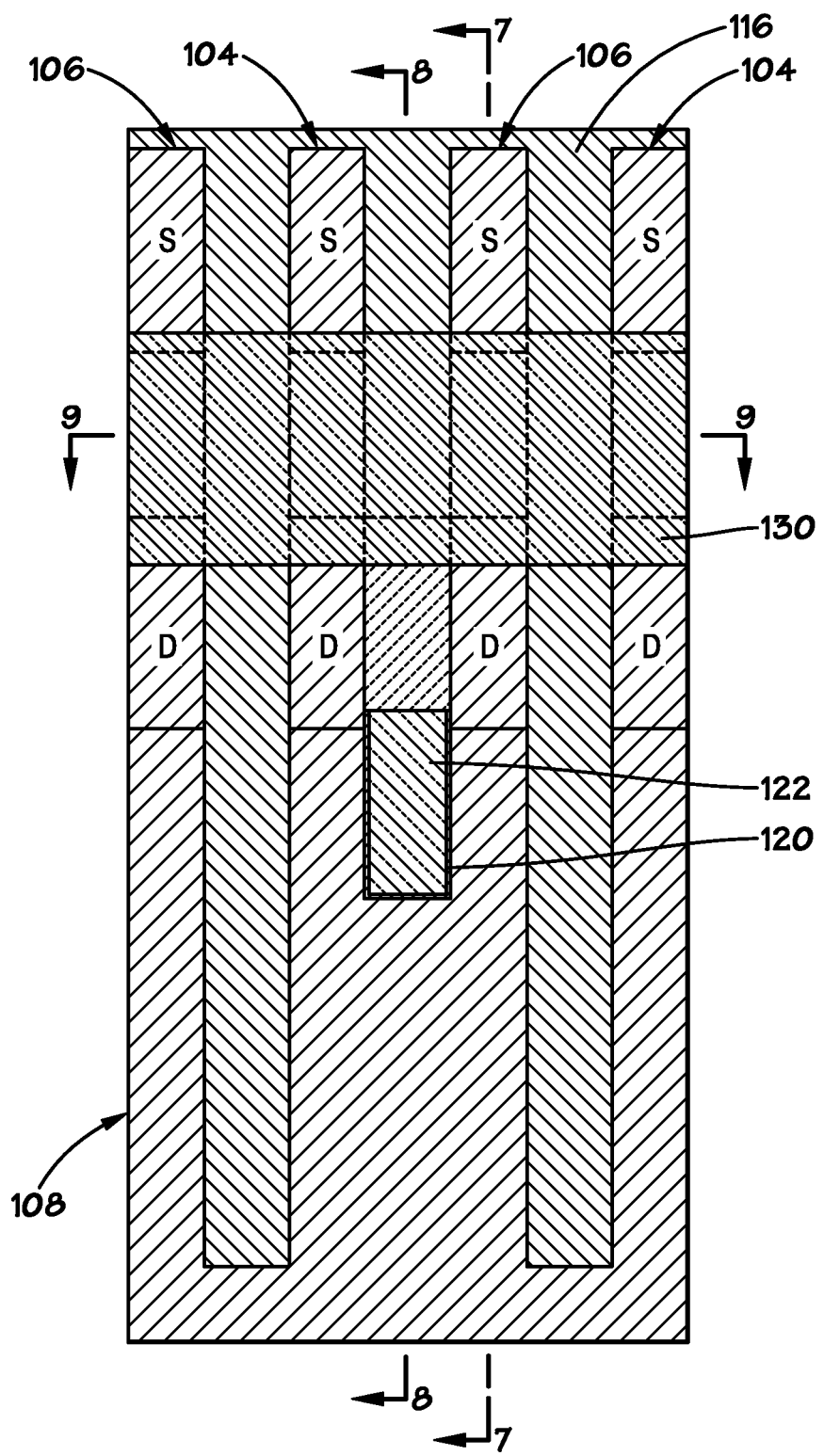
FIG. 6 illustrates a partial cross-sectional view of the memory array of FIG. 5 illustrating additional features, including a word line, in accordance with embodiments of the invention.
Figure 7:
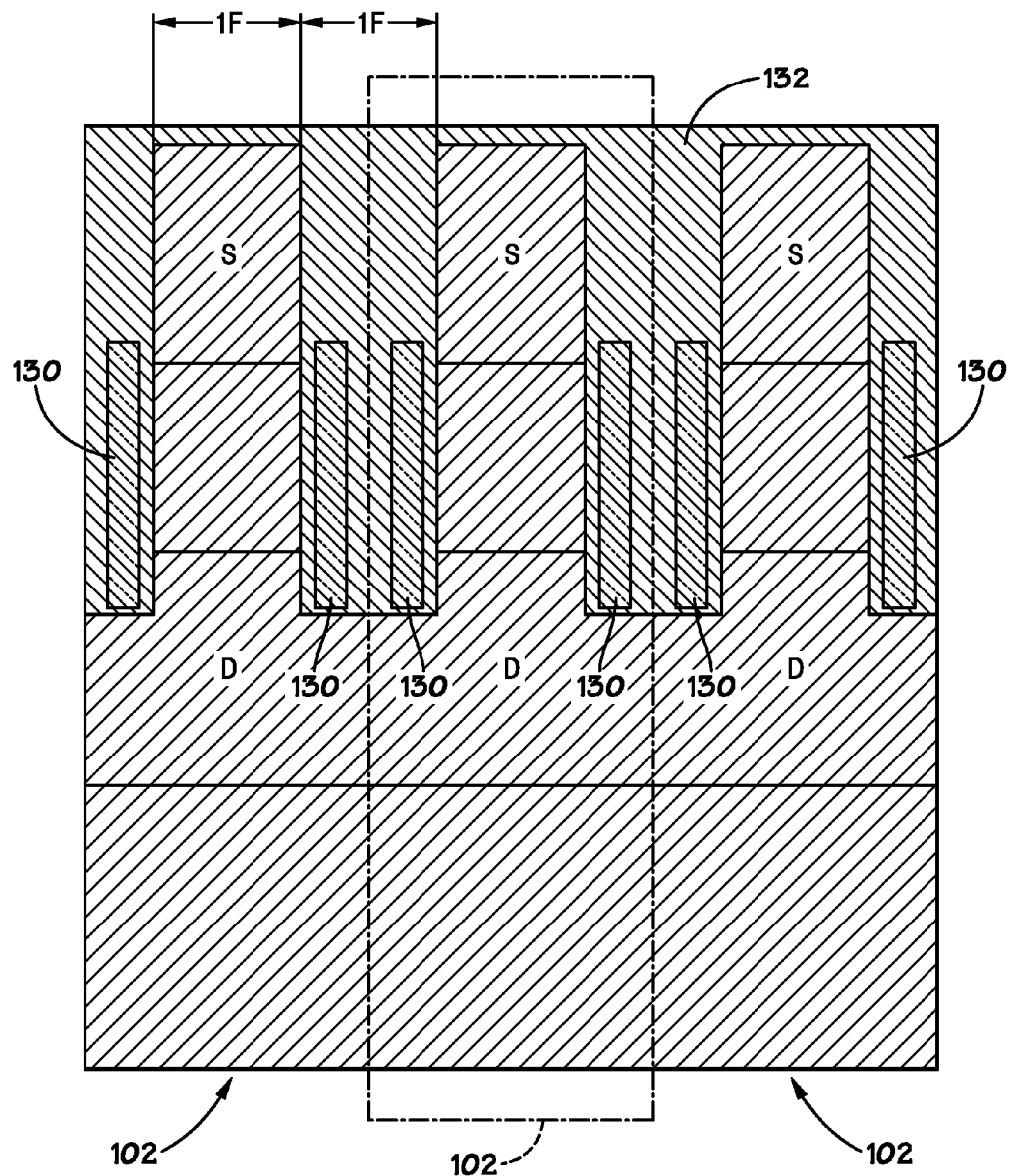
FIG. 7 illustrates a cross-sectional view of the memory array of FIG. 6, through a fin column of a finFET, in accordance with embodiments of the invention.
Figure 8:
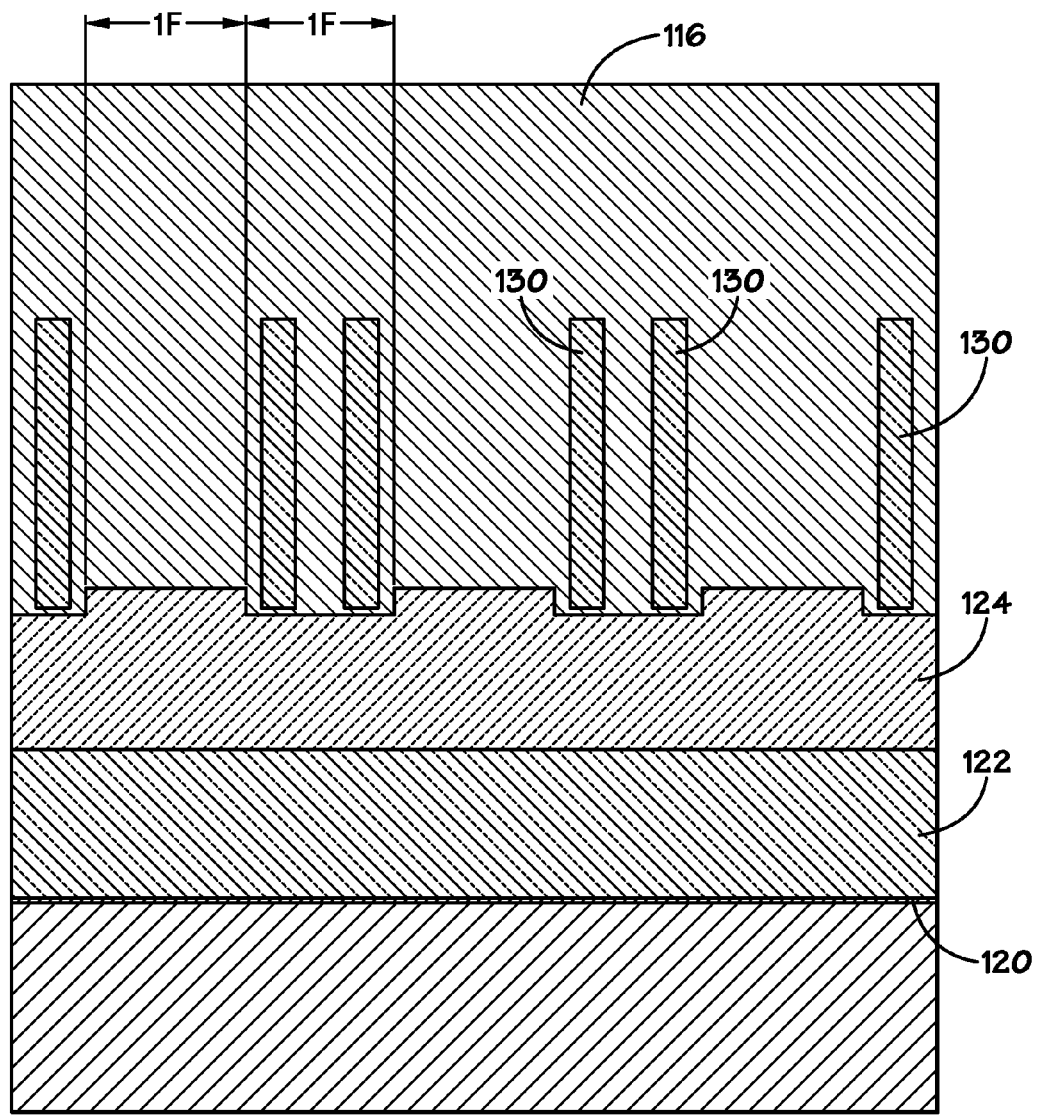
FIG. 8 illustrates a cross-sectional view of the memory array of FIG. 6, through an insulation material and a digit line, in accordance with embodiments of the invention.
Figure 9:
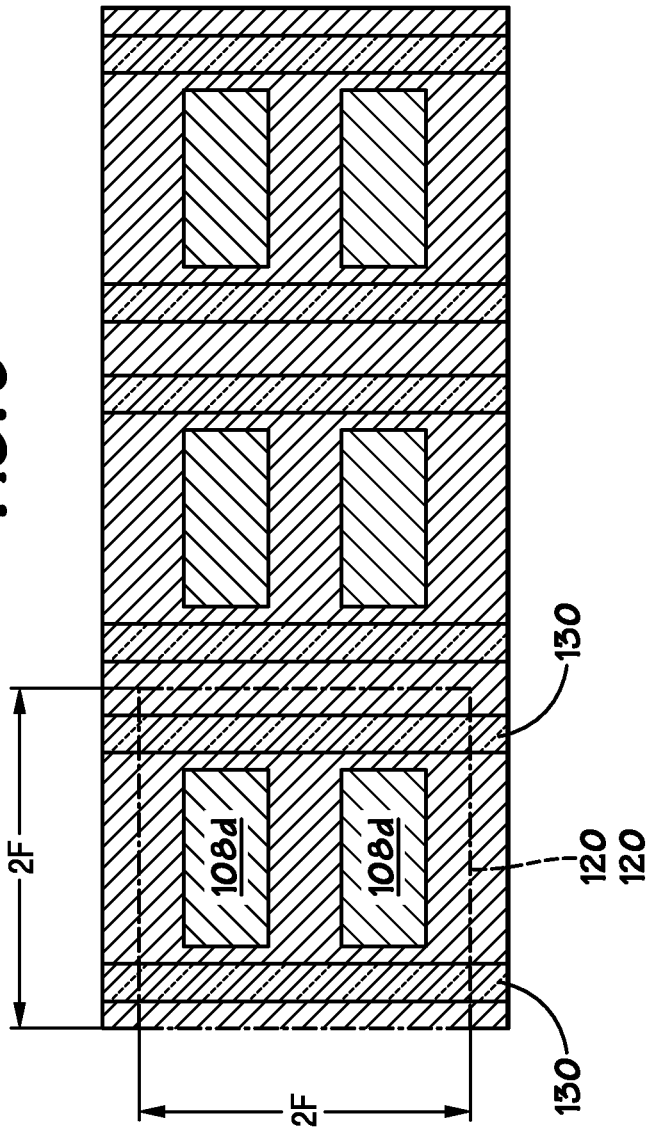
FIG. 9 illustrates a top cross-section view of the memory array of FIG. 6, in accordance with embodiments of the invention.

FIGS. 3-10 illustrate various cross-sectional views of memory cells fabricated in accordance with embodiments of the invention. As will be appreciated, these memory cells may be incorporated into a system, memory device and/or memory array illustrated in FIG. 2. Specifically, FIGS. 3-6 and 10 illustrate cross-sectional views through a portion of the rows (i.e., a cross-section taken in the direction of the word lines) during various steps in the fabrication process, highlighting various aspects of the array. FIGS. 7 and 8 illustrate cross-sectional views at various points through a portion of the word lines and taken in a direction of the digit lines. FIG. 9 illustrates a cross-sectional view of the top of a portion of the array.

Figure 3:
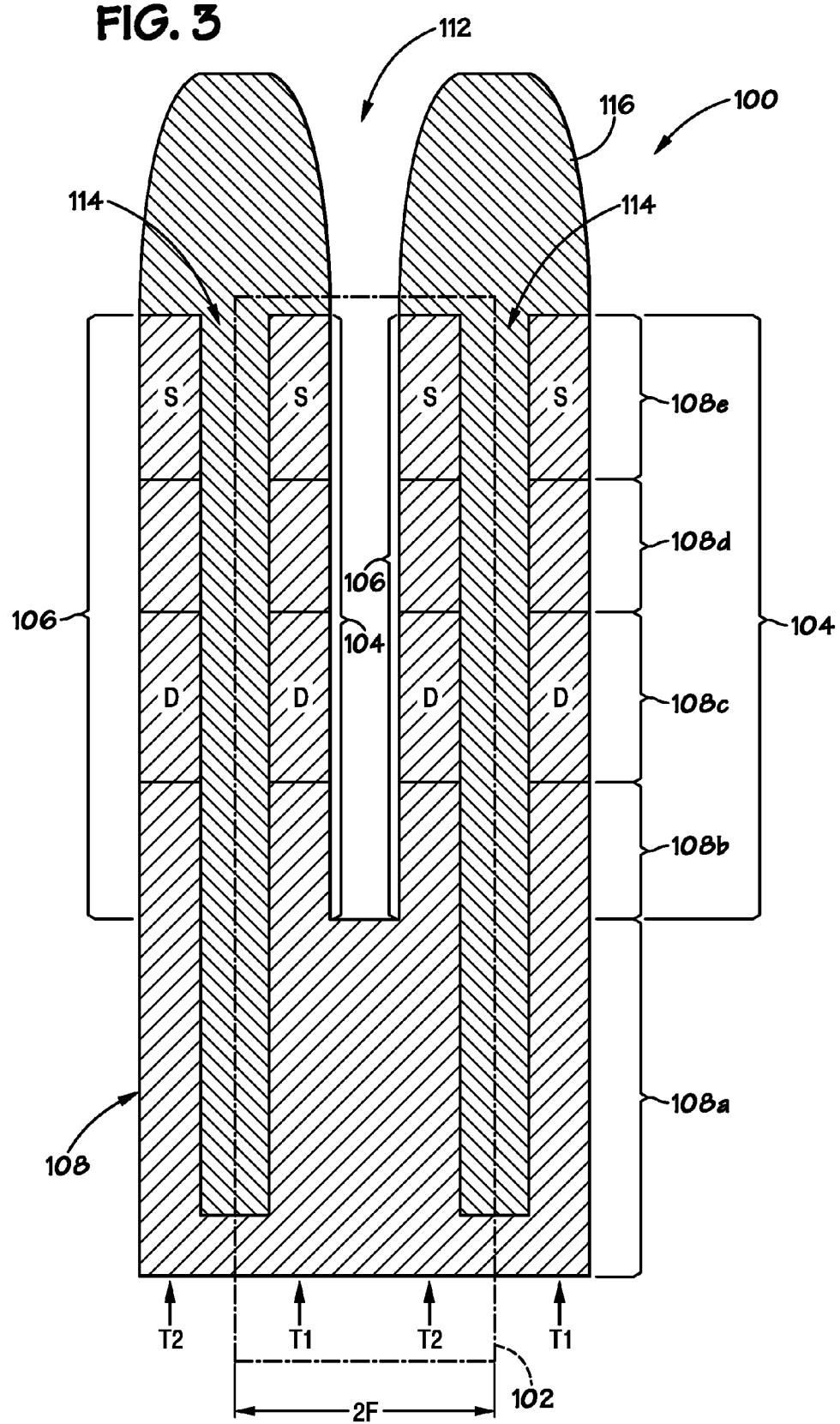
FIGS. 3-5 illustrate cross-sectional views through a portion of the rows of the memory array during various steps in the fabrication process.
Figure 4:
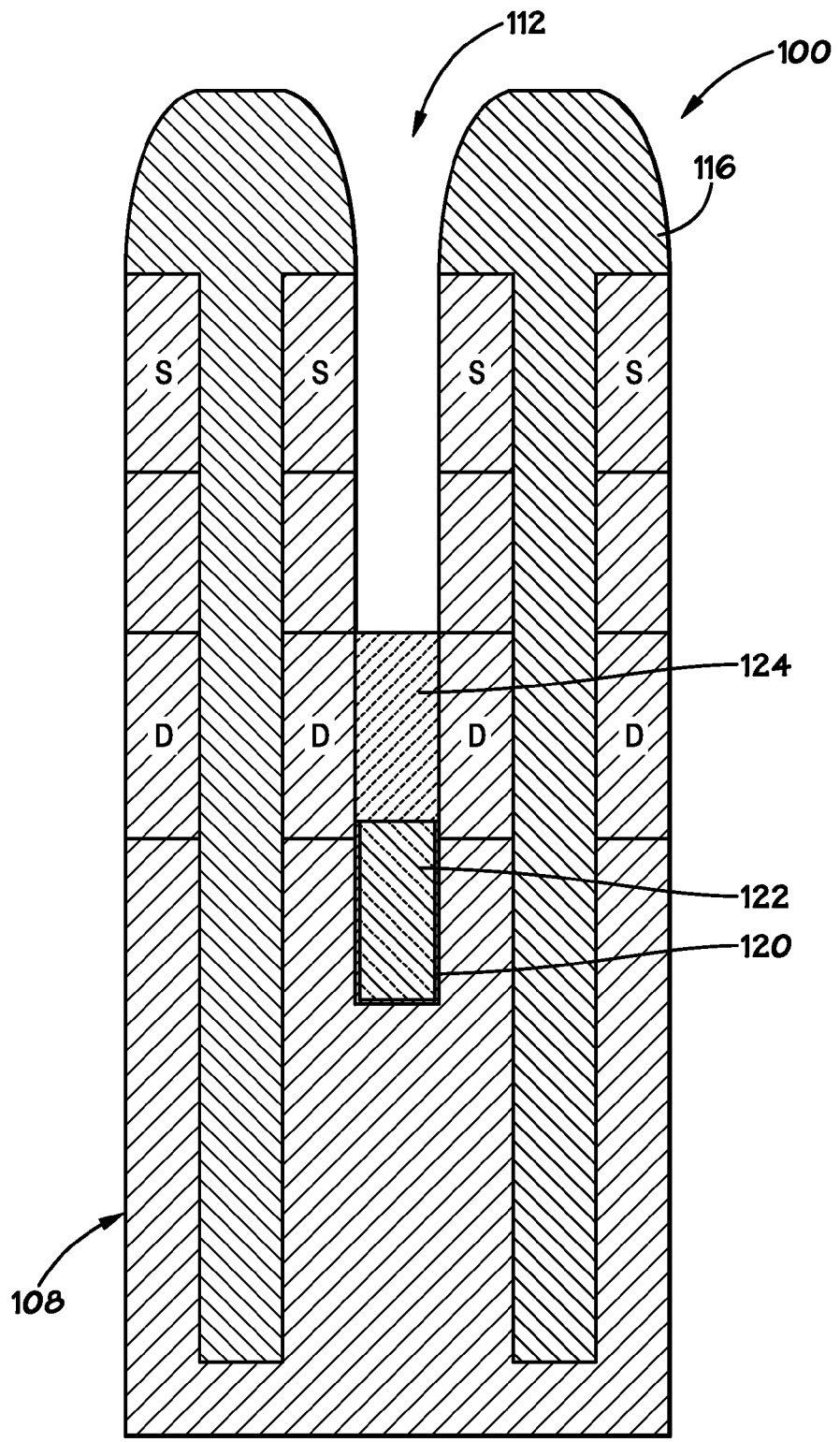

Referring initially to FIGS. 3-5, various steps in the fabrication process are illustrated to depict certain aspects of the illustrated embodiment. As previously described, each of these figures illustrates a cross-sectional view of a portion of an array, through the digit lines (or trenches wherein the digit lines are later formed) of the array in a direction of the word lines. Turning now to FIG. 3, a cross-sectional view through a memory cell of a DRAM memory array 100 and fabricated in accordance with embodiments of the present invention is illustrated. As previously described, each memory cell 102 includes two fins 104 and 106 extending in a direction generally perpendicular to the plane of the substrate, on which the memory cells are fabricated. In general, the left fin 106 and the right fin 104 of each memory cell 102, are each employed to form the two finFETs of the memory cell 102, as will be described further below. That is, the drain (D), source (S) and channel of the first transistor T1 of each memory cell 102, may be formed in the left fin 106, while the drain (D), source (S) and channel of the second transistor T2 of each memory cell 102, may be formed in the right fin 104, for instance.

As will be appreciated, the memory cell 102 is fabricated on a substrate through a variety of steps including forming material (e.g., deposition, growth, etc.), patterning the material, removing portions of the material (e.g., etching) and/or doping certain regions of the material. In the illustrated embodiment, the substrate 108 is provided and may be made from a variety of semiconductor materials, such as single-crystal silicon. The memory array 100 is fabricated by forming structures in and/or on the substrate 108. As will be apparent, before patterning and etching begins, the substrate 108 may be formed of a number of semiconductor layers 108*a-e*, doped in a variety of ways to ultimately provide the desired functionality, based on their known properties. For instance, if the base layer 108*a* is a p-type semiconductor material, the layers 108*c* and 108*e* may be heavily doped n+ layers formed through field implantation, such that they may be patterned to form the source (S) and drain (D) of each transistor. The intervening layers 108*b* and 108*d* are typically formed of the same type material as the base layer 108*a* (e.g., p-type). The layers 108*a-e* of the substrate 108 are typically formed, deposited and/or doped to provide the desired properties such that once patterned, they may be employed to form the integrated circuit structures (e.g., transistors) utilized in the array 100, as described further below.

Each memory cell 102 includes two fins 104 and 106 extending from a base layer 108*a* of the substrate 108. The fins 104 and 106 are separated by a shallow trench 112, extending through the surface of the substrate 108 to the base layer 108*a* of the substrate 108. The depth of the shallow trench 112 may be in the range of approximately 1500 to 2500 angstroms, e.g., 2000 angstroms. Each memory cell 102 is separated from an adjacent memory cell 102 along the row by a deep trench 114, having an isolation material 116 (e.g., oxide) deposited therein. The depth of the deep isolation trench 114 may be in the range of approximately 2500 to 3500 angstroms, e.g., 3000 angstroms. The deep isolation trench 114 formed between each memory cell 102 will have a depth greater than the depth of the shallow isolation trench 112 formed between each respective transistor T1 and T2 of a respective memory cell 102.

In accordance with the illustrated embodiment, each memory cell 102 has a cell size of approximately $4F^2$, where F is the minimum realizable feature dimension, or approximately half of the minimum pitch of the memory array in any direction. The pitch may be defined as the distance between one structure of a cell and the same structure in the next cell. As illustrated, each structure of the memory cell 102 (e.g., the fin 104) is separated from a like structure of the next adjacent memory cell in a row by approximately 2F. Similarly, as will be best illustrated in FIGS. 9 and 10, each structure the memory cell 102 is separated from a like structure of the next memory cell 102 in a column by approximately 2F. As will be illustrated with regard to FIG. 10, the storage device of each memory cell is formed above, and within the geometry of the 2F×2F size. Accordingly, each memory cell 102 is said to have a cell size of approximately $4F^2$. It can also be said that the row pitch (distance between each row) and column pitch (distance between each column) are each 2F.

In the illustrated embodiment, each fin 104 and 106 has a width of approximately ½ F, in a direction through the column (as in FIG. 3). Each shallow trench 112 and each deep trench 114 is also approximately ½ F wide. As will be appreciated, various cell sizes, such as $6F^2$ or $8F^2$, may also be fabricated in accordance with the embodiments described herein. The ultimate cell size may be dependent on resolution limitations of the fabrication tools being utilized, as well as design choices, including the type of architecture (e.g., open or folded), utilized in the array.

As one example, the memory array 100 may be fabricated by performing the following steps. The substrate 108 is created with appropriate layers 108*a-e* and doped to form the drain (D) and the source (S) in areas similar to those shown. In other embodiments, the location of the drain (D) and the source (S) can be altered or reversed. The methods of forming the substrate 108, having upper and lower doped regions, including the drain (D) and the source (S), are known to those skilled in the art. As previously described, each of the layers 108*a-e* of the substrate 108 may be formed before any of the trenches (e.g., 112 or 114) are formed in the substrate 108.

After the substrate 108 is formed, deep column isolation trenches 114 may be etched into the surface of the substrate 108, such that they run the entire length of the column of the array 100. The deep trenches 114 create a pattern to form continuous substrate pillars in which the transistors T1 and T2 of the memory cell 102 are formed. The deep trenches 114 may extend to a depth between 2500 and 3500 angstroms, for instance 3000 angstroms, into the surface of the substrate 108. In alternate embodiments, the deep trenches 114 may be 2000 angstroms, 4000 angstroms, or other depths particular to the embodiment. The deep trenches 114 are approximately ½ F in width, with the substrate pillars initially being approximately 1½ F in width. In alternate embodiments, the deep trenches 114 may be ¼ F, 1 F, or other widths, while the substrate pillars may also be various widths, such as ¾ F, or 3 F. After etching, the deep trenches 114 may be filled with an isolation material 116 that extends beyond the surface of the substrate 108 to create a surface layer of isolation material 116 over the surface of the substrate. The isolation material may be an oxide, or another dielectric material.

After the isolation material 116 is deposited to fill the deep column isolation trenches 114, and cover the surface of the substrate 108, shallow transistor isolation trenches 112 are etched through the surface of isolation material 116 and, in the illustrated embodiment, through the middle of the pillars previously formed in the substrate 108. As will be appreciated, by filling the deep isolation trenches 114, before forming the shallow isolation trenches 112, the pillars will be more resistant to structural collapse during formation of the fins 104 and 106. The shallow trenches 112 may extend to a depth in the range of about 1750 to 2250 angstroms, for instance 2000 angstroms, below the surface of the substrate 108. In alternate embodiments, the shallow trenches 112 may be 1500 angstroms, 2500 angstroms, or other depths particular to the embodiment, and dependent upon the thickness of the various layers 108*a-e* in the substrate. The shallow trenches 112 are approximately ½ F in width, with approximately ½ F of partial substrate pillars left on either side of the shallow trenches 118. In alternate embodiments, the width of the shallow trenches 112 may vary. The partial substrate pillars will form the fins 104 and 106 of the respective transistors T1 and T2 of the illustrated embodiments. The structure to this point in the fabrication process is illustrated in FIG. 3.

Turning now to FIG. 4, once the structure described above with regard to FIG. 3 is fabricated, the buried digit line (DL) may be formed. As used herein, a "buried" digit line (DL) is said to be formed in a horizontal plane below a horizontal plane of each of the channels of the finFETs 104 and 106, the word lines 130 (FIG. 6), and below the horizontal plane in which the storage device is fabricated, as discussed further below. Specifically in forming the buried digit line (DL), an oxide 120 or another thin dielectric material may be grown or formed on the side walls of the shallow trench 112. Next, a conductive material, such as a metal (e.g., tungsten) may be deposited in the trench 112 on top of the oxide 120, such that it fills the shallow trench 112. Next, the conductive material and the oxide 120 in the trench may be recessed (via etching, for instance), to form the buried digit line 122, illustrated in FIG. 4. For instance, the conductive material and the oxide 120 in the trench 112 may be etched to a depth of approximately 1000-2000 angstroms (e.g., 1500 angstroms) below the upper surface of the substrate 108. Accordingly, the remaining conductive material that forms the buried digit line 122 may have a vertical thickness of approximately 500 angstroms, for instance. As will be appreciated, the digit line 122 is electrically coupled to the drains (D) of the finFETs (T1 and T2) directly adjacent to the digit line 122 along the walls of the trench 112. In an alternate embodiment, the oxide 120 may be omitted. In the illustrated embodiment, the buried digit line 122 is formed in a lower plane of the memory cell 102, and thus spaced from the later formed capacitor, described below with reference to FIG. 10. Accordingly, during operation of the memory cell 102, any electrical coupling between the digit line 122 and a capacitor plate will be eliminated.

Next, a doped polysilicon may be deposited in the trench 112 on top of the digit line 122, and recessed (via etching, for instance) to form the polysilicon structure 124. The polysilicon 124 may be doped with phosphorus, for instance. In one embodiment, the polysilicon 124 has a thickness of approximately 500 angstroms, after being recessed. As will be described further below, the polysilicon 124 provides a buffer between the digit line 122 and the later formed word line. Further, the polysilicon 124 provides a desirable ohmic contact with the drains (D) of the adjacent finFETs (T1 and T2).

Next, a trench isolation material 126 is deposited into the trench 112, on top of the polysilicon 124, as illustrated in FIG. 5. The isolation material 126 may be any suitable dielectric, such as an oxide. The isolation material 126 may fill the trench 112 and may be deposited such that it covers the upper portion of the isolation material 116 (illustrated in FIG. 4). Finally, the isolation material 116 and isolation material 126 may be planarized (e.g., by a chemical process, a mechanical process or chemical-mechanical process) to produce a planar surface 128, on which additional components, such as a capacitor, may be fabricated.

FIG. 6. illustrates the array 100 of FIG. 5, with the additional depiction of a word line 130. As will be illustrated further with respect to FIGS. 7-9, the word lines 130 are formed in a direction orthogonal to the digit lines 122, and are formed on each side of the fins 104 and 106 of the finFETs T1 and T2. As will be appreciated, the word lines 130 are formed from a conductive material, such as polysilicon. A gate oxide (not shown) may also be formed between the word lines 130 and the fins 104 and 106. During operation, an operating current applied to the word lines 130 will activate the finFETs such that current moves through the vertical channel in the fins 104 and 106 from the drain (D) to the source (S). The word line 130 is sized to overlap the drain (D) and the source (S) regions. The vertical height of the word line 130 provides better channel control when it is greater than two times the fin thickness, although other embodiments may utilize other word line heights. In this embodiment, the fin thickness is 1F (as shown in FIG. 7), so the word line 130 provides better channel control if it is greater than 2F, for instance. The word lines 130 may be formed by etching trenches along the rows of the array 100 and forming the word lines 130 in the trenches (via a spacer process, for instance). Those skilled in the art will appreciate the various techniques that may be employed to form the word lines 130 of the array 100.

As illustrated in FIG. 6, the digit line 122 is "buried" below the word line 130. That is, the buried digit line 122 is formed in a horizontal planar volume below a horizontal planar volume in which the word line 130 is formed. As used herein, "horizontal planar volume" refers to the horizontal plane in which a structure is formed, and further includes the height of the structure. That is, the horizontal planar volume is defined by a component in the X, Y and Z direction. Expressed another way, a horizontal planar volume is associated with an X-Y plane of a horizontal cross section of a structure, with the added component of the height of the structure, thereby effectively defining a three-dimensional plane that extends infinitely in each of the X and Y directions, but is bound by the height of the structure formed in the Z direction. Thus, in the illustrated embodiment of FIG. 6, and as used herein, the buried digit line 122 is formed in a first horizontal planar volume below a second horizontal planar volume of the word line 130. The horizontal planar volume of the buried digit line 122 is separated from the horizontal planar volume of the word line 130, and thus, these horizontal planar volumes do not overlap. Thus, these horizontal planar volumes can be said to be mutually exclusive. The same can be said for the horizontal planar volume in which the drains (D) are formed and the horizontal planar volume in which the sources (S) are formed, when compared to one another. In contrast, for instance, in the illustrated embodiment, the horizontal planar volume of the buried digit line 122, partially overlaps the horizontal planar volume of the drains (D). That is, these horizontal planar volumes partially overlap in the Z-direction and are thus not mutually exclusive.

FIG. 6 also illustrates cut lines 7-7, 8-8 and 9-9 further depicting various views of the structure. Referring to FIG. 7, a cross-sectional view of the structure of FIG. 6, taken through the cut line 7-7, is illustrated. Specifically, FIG. 7 illustrates a cross-section taken through the word lines 130 and fin 106, in a direction of the column (i.e., digit line 122). The cut line 7-7 is taken through the fin 106 of transistor T2 (FIG. 3). In the portion of the array 100 illustrated in FIG. 7, a portion of three adjacent rows is depicted. Thus, a portion of three finFETs of three memory cells 102, one in each row, is illustrated. As previously described, each transistor (e.g., T1 and T2) includes a word line 130 on each side of the fin 104 or 106. Similar to the isolation material 116 disposed in trenches 112 and 114 in a direction of the digit lines 122, trenches may be formed between each memory cell 102 in a direction of the word lines 130, through the array 100. The trenches may be filled with a dielectric material 132, such as an isolation oxide, after the word lines 130 are formed. The various techniques for forming the trenches between rows of the array may be similar to the techniques described above for forming the trenches between the columns.

In one embodiment, to fabricate the word lines 130, trenches are etched parallel to the surface of the substrate, but perpendicular (orthogonal) to the deep trenches 114 and the shallow trenches 112. The trenches may have a width of approximately 1F, and each fin structure may also have a width of approximately 1F, thereby providing a 2F cell size along the direction of the digit lines. In alternate embodiments, the trenches may be 0.5F, 1.5F, or other widths, while the spacing between the trenches may also be various widths, such as 0.5F, or 1.5F. The illustrated trenches may extend to a depth in the range of 900 to 1500 angstroms, for instance 1200 angstroms, into the surface of the substrate 108, such that they extend into the drain (D) region each finFET.

Next, a thin gate oxide may be formed within the trenches to coat the sides of the fins, such as by a chemical vapor deposition or growth process. Next, the word lines 130 may be formed through a spacer process, for instance. The spacer material may be etched during the process to provide the word lines 130. Finally, the isolation material 132, such as an isolation oxide, may be deposited to fill the remainder of the trenches and separate the word lines 130 of adjacent memory cells 102, as illustrated. Excess isolation material may be planarized to ensure a surface layer of isolation material remains above the surface of the substrate 108.

FIGS. 8 and 9 illustrate additional views. Specifically, FIG. 8 illustrates a cross-sectional view of the structure shown in FIG. 6, with cut lines 8-8 taken through the oxide 120, digit line 122, polysilicon 124 and isolation material 126, deposited in the shallow trench 112 between the fins 104 and 106. FIG. 9 illustrates a top view of the structure at a cross-section taken through cut lines 9-9 of FIG. 6. The top view of the memory cell 102, taken through the cute lines 9-9 includes two word lines 130, and a portion of the fins 104 and 106, through the layer 108d of the substrate 108 (FIG. 3). As illustrated, the memory cell 102 has a cell area of 2F×2F and creates a 4F$^2$ architecture. As previously discussed, in alternate embodiments, a 6F$^2$, 8F$^2$, or other size architecture may be employed.

Figure 10:
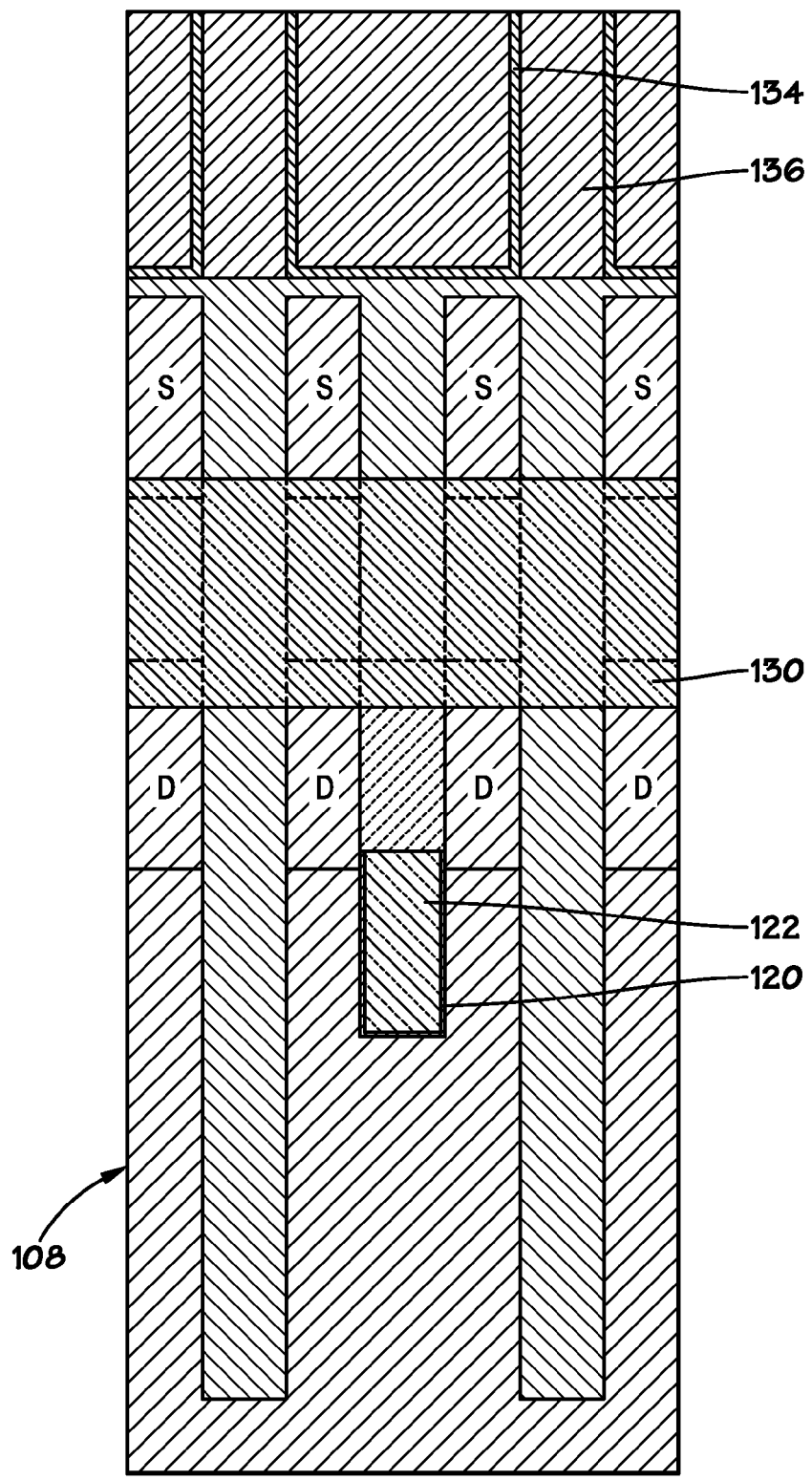
FIG. 10 illustrates a partial cross-sectional view of the memory array of FIG. 6 illustrating additional features, including a storage device, in accordance with embodiments of the invention.

FIG. 10 illustrates the cross-sectional view of the memory array 100 of FIG. 6, with the addition of the storage device. Specifically, the storage device in the illustrated embodiment is a container capacitor 134. As will be appreciated, the container capacitor 134 includes a dielectric material sandwiched between top and bottom electrodes. The bottom electrode of the capacitor 134 is electrically coupled to the source (S) of each fin 104 and 106 of the cell 102. Because each cell 102 includes two transistors T1 and T2 coupled to the capacitor 134, the resulting structure provides for a relatively large area capacitor for increased storage and reduced leakage. The capacitors 134 are electrically isolated from one another by a dielectric material 136. In an alternate embodiment, the capacitor 134 may be a stacked capacitor having a generally cylindrical cup-shape, formed on top of a smaller cylindrical contact post. As will be appreciated, other storage devices, including other types of capacitors, may also be employed.

In order to remain within the 4F² cell size, each capacitor 134 is sized and arranged such that it remains within the horizontal planar footprint of the cell. Further, the geographic isolation of the capacitor 134 with respect to the digit line 122 minimizes or eliminates coupling capacitance on the digit line 122 from the capacitor 134. By providing a structure wherein the storage device (e.g., capacitor 134) is not fabricated in the same plane as the digit line 122 (i.e., the storage device is fabricated above or below the digit line, with respect to the plane of the substrate), the reduction in coupling capacitance may be realized. Further, with the digit line 122 arranged below the word line 130, and with neither the digit line 122, nor the word line 130 being formed on the same plane as the capacitor 134, the area occupied by the capacitor 134, above the access devices may be maximized. Still further, in the illustrated embodiments, the digit line 122 effectively provides a parasitic transistor in series with the access devices (T1 and T2) of the memory cell 120.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A memory cell comprising:
a storage device having a horizontal planar footprint, wherein the horizontal planar footprint of the storage device is the X-Y plane of a horizontal cross section of the storage device;
a vertical access device electrically coupled to the storage device and having a horizontal planar footprint, wherein the horizontal planar footprint of the vertical access device is the X-Y plane of a horizontal cross section of the vertical access device;
a word line electrically coupled to the vertical access device; and
a buried digit line electrically coupled to the vertical access device and disposed below the storage device, the word line, and the vertical access device;
wherein the horizontal planar footprint of the storage device is equivalent to the horizontal planar footprint of the vertical access device.

2. The memory cell of claim 1, wherein the word line and the buried digit line are orthogonal to each other.

3. The memory cell of claim 1, wherein the storage device is disposed above the vertical access device.

4. The memory cell of claim 1, wherein the storage device is disposed above the word line.

5. The memory cell of claim 1, wherein the storage device comprises a capacitor.

6. The memory cell of claim 1, wherein the vertical access device comprises a finFET.

7. The memory cell of claim 6, wherein the finFET comprises a fin, and the vertical height of the word line is greater than two times the thickness of the fin.

8. The memory cell of claim 1, wherein the memory cell comprises at least two vertical access devices, each of which is disposed above the buried digit line.

9. The memory cell of claim 8, wherein the memory cell comprises at least two word lines electrically coupled to the vertical access devices.

10. The memory cell of claim 1, wherein the vertical access device comprises a source region and a drain region, the source region and the drain region being located at different heights in the vertical access device, and wherein the word line is configured to overlap both the source region and the drain region.

11. A memory array comprising:
a memory cell having two vertical access devices electrically coupled to and disposed below a storage device, wherein:
each of the two vertical access devices has a horizontal planar footprint, the horizontal planar footprint of the vertical access device being the X-Y plane of a horizontal cross section of the vertical access device;
the storage device has a horizontal planar footprint, the horizontal planar footprint of the storage device being the X-Y plane of a horizontal cross section of the storage device; and
the horizontal planar footprint of the storage device is equivalent to a combined horizontal planar footprint of the two vertical access devices comprising the sum of the horizontal planar footprint of each of the two vertical access devices;
a word line electrically coupled to the memory cell; and
a buried digit line electrically coupled to the memory cell and disposed below the memory cell and the word line.

12. The memory array of claim 11, wherein the word line and the buried digit line are orthogonal to each other.

13. The memory array of claim 11, wherein the word line is disposed below the storage device.

14. The memory array of claim 11, wherein the memory array comprises dynamic random access memory (DRAM).

15. The memory array of claim 11, wherein the memory array comprises static random access memory (SRAM).

16. The memory array of claim 11, wherein the memory array comprises read-only memory (ROM).

17. The memory array of claim 11, wherein the memory array comprises a first word line and a second word line parallel to one another, and wherein the first and second word lines are electrically coupled to the two vertical access devices of the memory cell.

18. The memory array of claim 11, wherein each of the vertical access devices comprises a finFET.

19. The memory array of claim 11, wherein the storage device comprises a capacitor.

20. A system comprising:
a processor;
an address bus;
a decoder block configured to receive and translate address information from the processor via the address bus; and
a memory array arranged to receive translated address information from the decoder block, the memory array comprising:
a plurality of memory cells, each memory cell comprising a storage device having a horizontal planar footprint, the horizontal planar footprint of the storage device being the X-Y plane of a horizontal cross section of the storage device and a vertical access device having a horizontal planar footprint, the horizontal planar footprint of the vertical access device being the X-Y plane of a horizontal cross section of the vertical access device, wherein the horizontal planar footprint of the storage device is equivalent to the horizontal planar footprint of the vertical access device;
a word line electrically coupled to the vertical access device of each memory cell; and a buried digit line electrically coupled to the vertical access device of one of the plurality of memory cells and disposed below the plurality of memory cells and the word line.

21. The system of claim 20, wherein the plurality of memory cells are configured in a grid formation, and wherein the address decoder block comprises a row decoder block and a column decoder block.

22. The system of claim 20, wherein the memory array comprises DRAM, SRAM, ROM, or any combination thereof.

23. The system of claim 20, wherein each of the plurality of memory cells comprises two vertical access devices, and wherein the horizontal planar footprint of the storage device is equivalent to a combined horizontal planar footprint of the two vertical access devices comprising a sum of the horizontal planar footprint of each of the two vertical access devices.

\* \* \* \* \*